US009819266B2

(12) United States Patent
Vaidya et al.

(10) Patent No.: US 9,819,266 B2
(45) Date of Patent: Nov. 14, 2017

(54) DIGITALLY CONTROLLED ZERO CURRENT SWITCHING

(71) Applicant: Intel Corporation, Santa Clara, CA (US)

(72) Inventors: Vaibhav Vaidya, Portland, OR (US); Vivek K. De, Beaverton, OR (US); Krishnan Ravichandran, Saratoga, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/757,732

(22) Filed: Dec. 23, 2015

(65) Prior Publication Data
US 2017/0187283 A1   Jun. 29, 2017

(51) Int. Cl.
*H02M 3/158*   (2006.01)

(52) U.S. Cl.
CPC .................................. *H02M 3/158* (2013.01)

(58) Field of Classification Search
CPC ................ H02M 3/158; H02M 3/157; H02M 2001/0012
USPC ........................................................ 323/283
See application file for complete search history.

(56) References Cited

U.S. PATENT DOCUMENTS

| 5,678,025 A | 10/1997 | Ghori et al. |
| 2004/0212347 A1* | 10/2004 | Fogg ................. G01R 31/3606 320/127 |
| 2008/0259647 A1 | 10/2008 | Risseeuw |
| 2009/0115388 A1 | 5/2009 | Miyazaki et al. |
| 2009/0295350 A1* | 12/2009 | Yamada .............. H02M 3/1588 323/282 |
| 2011/0148377 A1* | 6/2011 | Schiff ................. H02M 3/1588 323/283 |
| 2014/0191744 A1* | 7/2014 | Choi ..................... H02M 3/156 323/283 |

(Continued)

FOREIGN PATENT DOCUMENTS

| JP | 2004-129393 A | 4/2004 |
| KR | 10-2013-0060992 A | 6/2013 |

OTHER PUBLICATIONS

International Search Report and Written Opinion issued in PCT Application No. PCT/US2016/063667, dated Mar. 16, 2017, 13 pages.

*Primary Examiner* — Adolf Berhane
*Assistant Examiner* — Bart Iliya
(74) *Attorney, Agent, or Firm* — Grossman, Tucker, Perreault & Pfleger, PLLC

(57) ABSTRACT

Generally, this disclosure describes an apparatus. The apparatus includes switch controller circuitry and zero crossing logic circuitry. The switch controller circuitry is to control a conduction state of a high side switch and a low side switch in a DC to DC converter. The zero crossing logic circuitry includes phase comparator circuitry, a first clocking circuitry and a second clocking circuitry. Each clocking circuitry includes one or more delay elements. The zero crossing logic circuitry is to monitor a switch node voltage, Vsw, and to determine whether Vsw is greater than a reference, Vref. The switch controller circuitry is to turn off a low side switch if Vsw is greater than Vref while the low side switch is turned on, Vsw greater than Vref corresponding to a negative inductor current.

25 Claims, 5 Drawing Sheets

(56) References Cited

U.S. PATENT DOCUMENTS

| | | | |
|---|---|---|---|
| 2015/0091536 A1* | 4/2015 | Tanaka | H02M 3/156 323/235 |
| 2015/0194891 A1 | 7/2015 | Kim et al. | |
| 2016/0126836 A1* | 5/2016 | Schmitz | H02M 3/157 323/271 |
| 2016/0276932 A1* | 9/2016 | Pullen | H02M 3/158 |

* cited by examiner

DIGITALLY CONTROLLED ZERO CURRENT SWITCHING

FIELD

The present disclosure relates to digital control for zero current switching in a switching converter power supply.

BACKGROUND

Inductor-based switching converters, e.g., buck DC-DC converters, implemented in CMOS (complementary metal oxide semiconductor) processes, can have relatively large inductor current ripple due to relatively small inductor values. The inductor size may be optimized for maximum load but the system may spend a significant amount of time in medium to light load conditions. During medium to light load conditions, in continuous conduction mode (CCM) regulation, steady-state negative going inductor current may cause efficiency loss without contributing to load current or to regulation.

Analog diode emulation techniques may be utilized to prevent negative current, thus increasing efficiency and reducing stress on the components caused by the negative current. Analog diode emulation techniques typically use analog circuitry, e.g., analog comparators, sense resistors, current mirrors, snubbers and/or amplifiers, etc. These analog circuits become challenging to scale and calibrate as high-speed converters are integrated into sub-micron manufacturing processes.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure relates to circuits, systems and methods configured to address challenges related to implementing inductor based DC-DC buck regulators on advanced CMOS (Complementary Metal Oxide Semiconductor) processes. In particular, the present disclosure relates to digital control for zero current switching in a switching converter power supply. In operation, during each switching cycle of a synchronous buck converter, a high side switch turns on and inductor current ramps up. The high side switch then turns off and a low side switch turns on to ramp down the inductor current. In less than maximum load conditions, the inductor current may swing negative during the low side switch ramp down when the average inductor current is less than half the peak to peak current. When the inductor current is negative (i.e., flowing out of the load capacitor), the voltage across the low side switch, $V_{LS}$, turns slightly positive. The voltage across the low side switch, $V_{LS}$, is equal to a difference between a switch node voltage, Vsw, and a reference voltage, Vref. If the reference is ground, then $V_{LS}$ equals Vsw. Thus, Vsw greater than Vref corresponds to a negative inductor current.

Circuits, systems and methods are configured to use a digital delay line to monitor the switch node voltage. The circuits, systems and methods are configured to determine whether the switch node voltage is greater than Vref or is starting to rise above Vref. The circuits, systems and methods are configured to signal that a low side switch should turn off if Vsw is greater than Vref to prevent the negative inductor current. Thus, the Vsw may be monitored and detection of Vsw greater than Vref may trigger turning off the low side switch. The buck converter may then operate in a diode emulation mode, preventing negative inductor currents and continuous conduction mode losses may be avoided.

The circuits, systems and methods of the present disclosure, while addressing the challenge of a specific converter (e.g., a buck converter), can also be utilized for other zero current switching transitions. The logic and circuitry described herein may be embodied as integrated circuit (IC) designs, such as a complementary metal oxide semiconductor (CMOS) design, etc. In other embodiments, the power supply circuitry may be implemented using modular power train integrated circuits (PTICs) with each power supply representing a slice of a common die.

Figure 1:
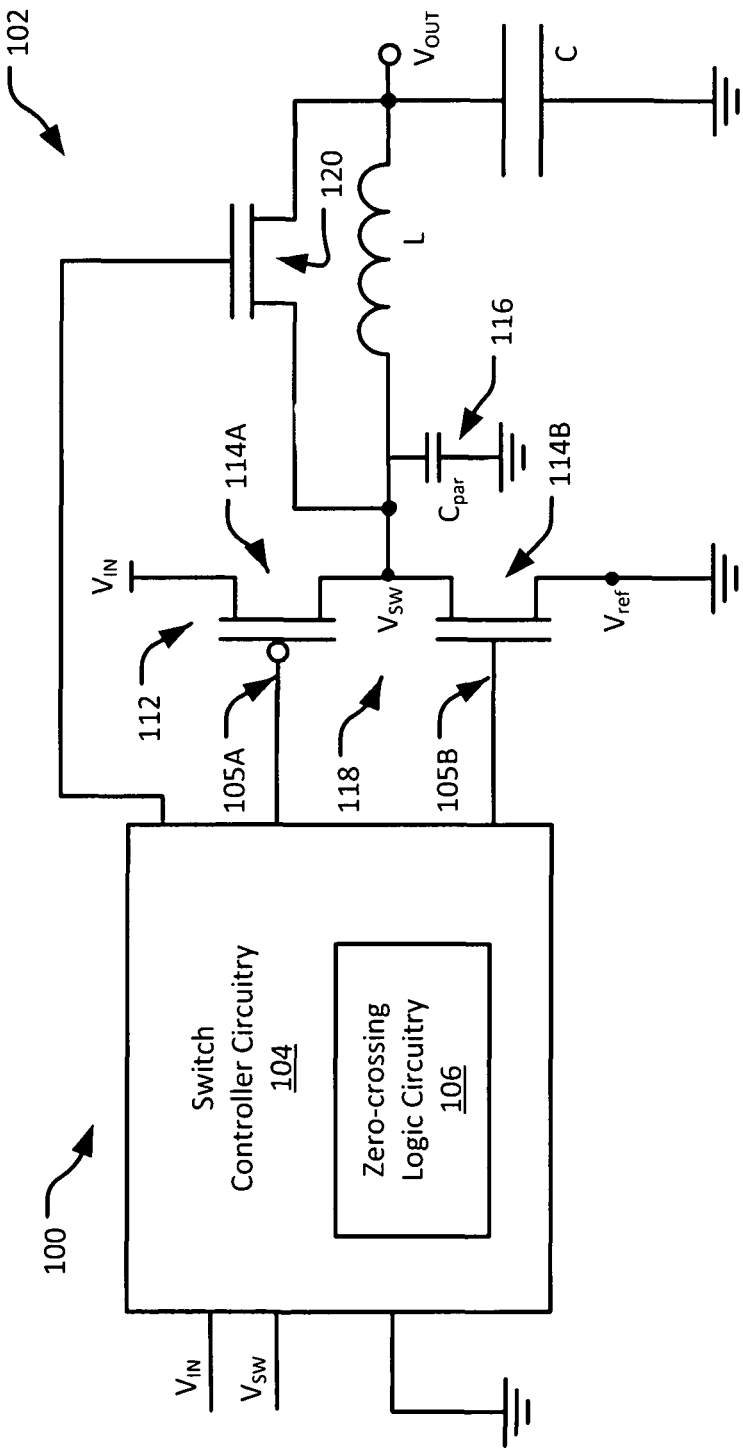
FIG. 1 illustrates a power supply system consistent with various embodiments of the present disclosure.

FIG. 1 illustrates a power supply system 100 consistent with various embodiments of the present disclosure. Power supply system 100 generally includes switch controller circuitry 104 configured to control DC-DC converter circuitry 102. In some embodiments, the power supply system 100 may include switch 120, as will be described in more detail below. The DC-DC converter circuitry 102, may include a switched DC/DC converter power supply topology, for example, known and/or after-developed switched DC/DC converter topology such as Buck, boost, Buck-boost, SEPIC (single-ended primary inductor converter), Class D, etc.

In the example of FIG. 1, the DC-DC (i.e., DC to DC) converter circuitry 102 is a Buck converter topology that includes a pair of switches, e.g., first switch 114A and second switch 114B (e.g., CMOS switch devices) in a half bridge arrangement 112 coupled between a voltage rail (i.e., supply voltage) Vin and a reference node Vref (e.g., ground). Switch 114A may be referred to herein as the high side switch, and switch 114B may be referred to herein as the low side switch.

The Buck converter topology 102 may also include an output stage that includes inductor circuitry (L) and capacitor circuitry (C). The Buck converter topology 102 may further include a parasitic capacitance 116 with capacitance Cpar configured to account for non-ideal circuit characteristics of Buck converter 102. Switch 114A may include a P-type switch (e.g., PMOS device) and switch 114B may include an N-type switch (e.g., NMOS device), however, it will be understood that in other embodiments, the switches 114A and 114B may both be NMOS switch devices, PMOS switch devices, and/or the switch 114A may be an NMOS switch device while the switch 114B may be a PMOS switch device.

The parasitic capacitance 116, inductor circuitry (L) and capacitor circuitry (C) may be coupled between the switches 114A and 114B at a switched voltage node 118. A voltage at node 118 may then correspond to Vsw. As used herein, Vsw may refer to the voltage at switch node 118 and/or to the switch node itself 118.

Switch controller circuitry 104 is configured to generate switch control signals 105A and 105B to control the conduction state of each of the switches 114A and 114B to generate an output voltage (Vout) and output current. In some embodiments, the switch controller circuitry 104 may be configured to generate the switch control signals 105A and 105B as pulse width modulation (PWM) signals having a controllable duty cycle to control power delivered to a load (not shown) coupled to Vout. In other embodiments, the switch controller circuitry 104 may be configured to generate the switch control signals 105A and 105B as pulse frequency modulation (PFM) signals having a controllable frequency to control power delivered to a load (not shown) coupled to Vout.

Thus, switch controller circuitry 104 may be configured to sense Vout and/or load current and to adjust the duty cycle and/or frequency accordingly. In the example circuitry of FIG. 1, when the switch control signal 105A is low, the PMOS switch 114A is turned ON, and when the switch control signal 105B is high, the NMOS switch 114B is turned ON. Conversely, when the switch control signal 105A is high, the PMOS switch 114A is turned OFF, and when the switch control signal 105B is low, the NMOS switch 114B is turned OFF.

Switch controller circuitry 104 may be configured to control switches 114A, 114B in the continuous conduction mode (CCM). When a maximum load current is being drawn from power supply system 100, continuous conduction mode means that the inductor current does not go below zero. A Buck DC to DC converter is designed to be efficient at maximum load current, i.e., Inductor current greater than or equal to zero. In the continuous conduction mode, during the portion of a cycle when the low side switch 114B is turned on and the inductor current is ramping down, the switch node voltage Vsw may be equal to Vref and thus $V_{LS}=0$. If less than maximum current is being drawn, the lesser load current may result in a negative inductor current as the inductor current ramps down while the low side switch 114B is turned on. As the inductor current passes through zero, $V_{LS}$ may begin to increase from zero to a positive value related to the amount of inductor current and the on resistance of the low side switch 114B as $V_{LS}=$ Vsw−Vref=$I_L$*$R_{lowside}$ where Vsw is the switch node voltage $V_{LS}$, is the voltage across the low side switch, Vref is the reference voltage $I_L$ is inductor current and $R_{lowside}$ is the on resistance of the low side switch 114B. When Vref=0 (i.e., ground) $V_{LS}$=Vsw. To prevent the negative inductor current or to reduce the amount and duration of negative inductor current, switch controller circuitry 104 may be configured to monitor Vsw and to then turn off the low side switch 114B if an increase in Vsw is detected while low side switch 114B is on. Accordingly, switch controller circuitry 104 may also include zero crossing logic circuitry 106 to monitor Vsw.

The zero crossing logic circuitry 106 may be configured to monitor Vsw, to compare Vsw to a reference (e.g., ground) and to provide an output signal based on the result. For example, zero crossing logic circuitry 106 may be configured to output a logic one when the inductor current is positive (i.e., Vsw at or near Vref while the low side switch is turned on) or to output a logic one when the inductor current is and/or goes negative (i.e., Vsw greater than Vref while the low side switch is turned on). Switch controller circuitry 104 may then be configured to adjust low side switch control signal 105B to turn the low side switch 114B off, thus, implementing diode emulation and preventing further flow of negative inductor current.

Figure 2:
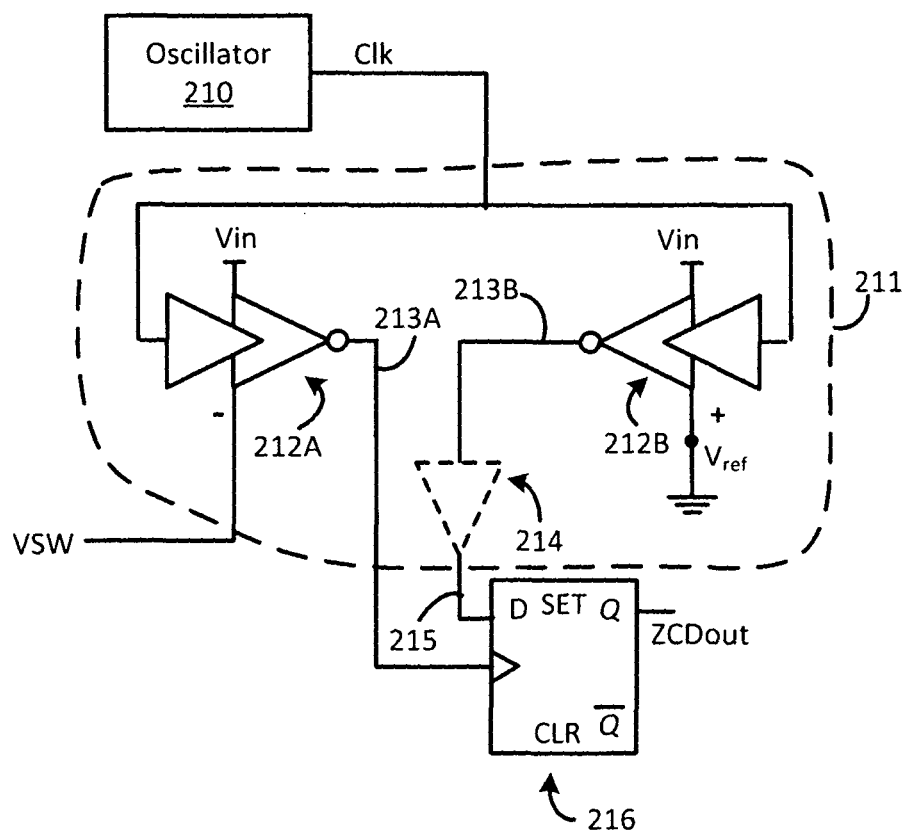
FIG. 2 illustrates one example zero crossing logic circuitry according to one example embodiment of the present disclosure.

FIG. 2 illustrates one example zero crossing logic circuitry 206 according to one example embodiment of the present disclosure. The zero crossing logic circuitry 206 is one example of zero crossing logic circuitry 106 of FIG. 1. The zero crossing logic circuitry 206 corresponds to a ground modulated delay line. In other words, a ground terminal (i.e., a reference) of the delay line supply voltage is decoupled from ground and coupled instead to a control input, e.g., Vsw. Thus, the ground reference may be modulated by Vsw.

The zero crossing logic circuitry 206 of this embodiment includes an oscillator 210, differential clocking circuitry 211 and phase comparator circuitry 216. In some embodiments, zero crossing logic circuitry 206 may include offset circuitry 214. Differential clocking circuitry 211 may include one or more process-dependent delay units, i.e., delay elements, e.g., first clocking circuitry 212A and second clocking circuitry 212B. The first clocking circuitry 212A is configured to clock (i.e., delay) the switch node voltage, Vsw. The second clocking circuitry 212B is configured to clock (i.e., delay) a reference voltage Vref, e.g., ground. For example, the first clocking circuitry 212A and the second clocking circuitry 212B may correspond to delay oscillators. In delay oscillators, a delay, i.e., a phase difference between the input clock signal and the output clock signal, is related to a supply voltage to the delay oscillator. In other words, varying a differential supply voltage across delay oscillator varies the phase difference between an input clock signal and the output clock signal. The clock signal (Clk) input to the first clocking circuitry 212A and the second clocking circuitry 212B, in this example, may be generated by oscillator 210. For example, oscillator 210 may correspond to ring oscillator circuitry and/or other circuitry configured to provide a relatively stable clock signal.

The first clocking circuitry 212A is configured to generate a first clocked signal 213A having a delay (or phase) relative to the input clock signal, Clk, based on a first differential voltage across the first clocking circuitry 212A. The first differential voltage corresponds to a difference between supply voltage, Vin, and switch node voltage, Vsw. Thus, if Vsw changes, the phase of the first clocked signal 213A relative to input clock signal, Clk, changes proportionally. Similarly, the second clocking circuitry 212B is configured to generate a second clocked signal 213B having a delay (or phase) relative to the input clock signal, Clk, based on a second differential voltage across the second clocking circuitry 212B. The second differential voltage corresponds to a difference between the supply voltage, Vin, and the reference Vref, e.g., ground. The supply voltage Vin and the reference may generally remain constant, thus the phase of the second clocked signal 213B may remain generally constant also. Thus, as Vsw changes, the phase of the first clocked signal 212A may change relative to the phase of the second clocked signal 213B. A phase difference, i.e., a delay, between the first clocked signal 213A and the second clocked signal 213B may then correspond to a difference between Vsw and Vref, i.e., $V_{LS}$, the voltage across low side switch 114B.

Differential clocking circuitry 211 and oscillator 210 are configured to accommodate process, voltage and/or temperature (PVT) variation. For example, similar to clocking circuitry 211, oscillator 210 may include process dependent delay units. The oscillation frequency may vary with PVT variation that may also cause operation of differential clocking circuitry 211 to vary. Thus, continued monitoring of Vsw in the presence of PVT variation may be facilitated by such construction of oscillator 210.

Initially, when the low side switch 114B turns on, the value of Vsw is lower than Vref, and thus, the phase of first clocked signal 213A is faster than the phase of second clocked signal 213B (relative to Clk). In other words, the first clocked signal 213A arrives before the second clocked signal 213B and the D flip flop registers a '0' input on the rising edge of 213B. When the low side switch 114B turns on, the inductor current is near maximum. As the inductor current ramps down and while the inductor current is greater than zero, Vsw rises from below Vref to closer to Vref. If the inductor current stays greater than zero, then Vsw does not cross Vref. If the inductor current goes negative, then when the inductor current crosses zero, Vsw may begin to increase above Vref, as described herein. As Vsw increases above Vref, a nonzero phase difference between the first clocked signal 213A and the second clocked signal 213B may occur. The phase difference is proportional to the difference between Vsw and Vref, i.e., $V_{LS}$.

In the example of FIG. 2, the phase comparator circuitry 216 corresponds to a D-type flip flop. Flip-flop circuitry 216 includes a clock input configured to receive the first clocked signal 213A. Flip-flop circuitry 216 further includes a D input configured to receive the second clocked signal 213B (or a delayed second clocked signal 215). In operation, flip-flop circuitry 216 is configured to latch data incident on the D input in response to a rising edge incident on the clock input. When Vsw is at or near Vref, a rising edge of the first clocked signal 213A may arrive at the clock input at or just after a rising edge of the second clocked signal 213B arrives at the D input. If Vsw is greater than Vref, the first differential voltage (Vin−Vsw) across first clocking circuitry 212A may be less than the second differential voltage (Vin−Vref) across second clocking circuitry 212B and a phase delay associated with the first clocked signal 213A may be greater than a corresponding phase delay associated with the second clocked signal 213B. Thus, when Vsw is below Vref, flip-flop circuitry 216 may latch a zero and if Vsw is greater than Vref, flip-flop circuitry 216 may latch a one. In other words, a phase delay (i.e., the first clocked signal 213A arriving at the clock input (CLK) of the D flip-flop after the second clocked signal 213B arrives at the D input) between the first clocked signal 213A and the second clocked signal 213B may allow the second clocked signal 213B incident on the D input to set up before the rising edge of the first clocked signal 213A reaches the clock input of flip-flop circuitry 216. The flip-flop circuitry 216 may then latch the logic one corresponding to the second clocked signal 213B, when the first clocked signal 213A reaches the clock input. The output (i.e., ZCDout) of flip-flop circuitry 216 may be provided to and captured by switch controller circuitry 104. Switch controller circuitry 104 may then be configured to turn off the low side switch 114B by, e.g., adjusting control input signal 105B to turn low side switch 114B off. Thus, further flow of negative inductor current may be prevented.

In some embodiments, zero crossing logic circuitry 206 may include offset circuitry 214 configured to add an additional delay to the second clocked signal 213B prior to provision of the second clocked signal 213B to flip-flop circuitry 216. In other words, offset circuitry is configured to adjust a threshold associated with flip flop circuitry 216. Offset circuitry 214 is configured to generate a delayed output signal 215, where the rising edge of the delayed output signal 215 is delayed compared to the rising edge of second clocked signal 213B. Delaying the second clocked signal 213B is configured to cause flip-flop circuitry 216 to latch a logic zero in response to receiving the first clocked signal when Vsw is less than a threshold voltage, the threshold voltage greater than Vref. The delay time of offset circuitry 215 may be selected based on, for example, a desired margin between the inductor current crossing zero and the low side switch 114B being turned off. The margin is configured to ensure that the low side switch 114B does not turn off while the inductor current is greater than zero. The margin may also provide a measure of noise immunity. Thus, the margin may allow at least some negative inductor current to flow in order to avoid switching the low side switch off while positive inductor current may be flowing.

Figure 3:
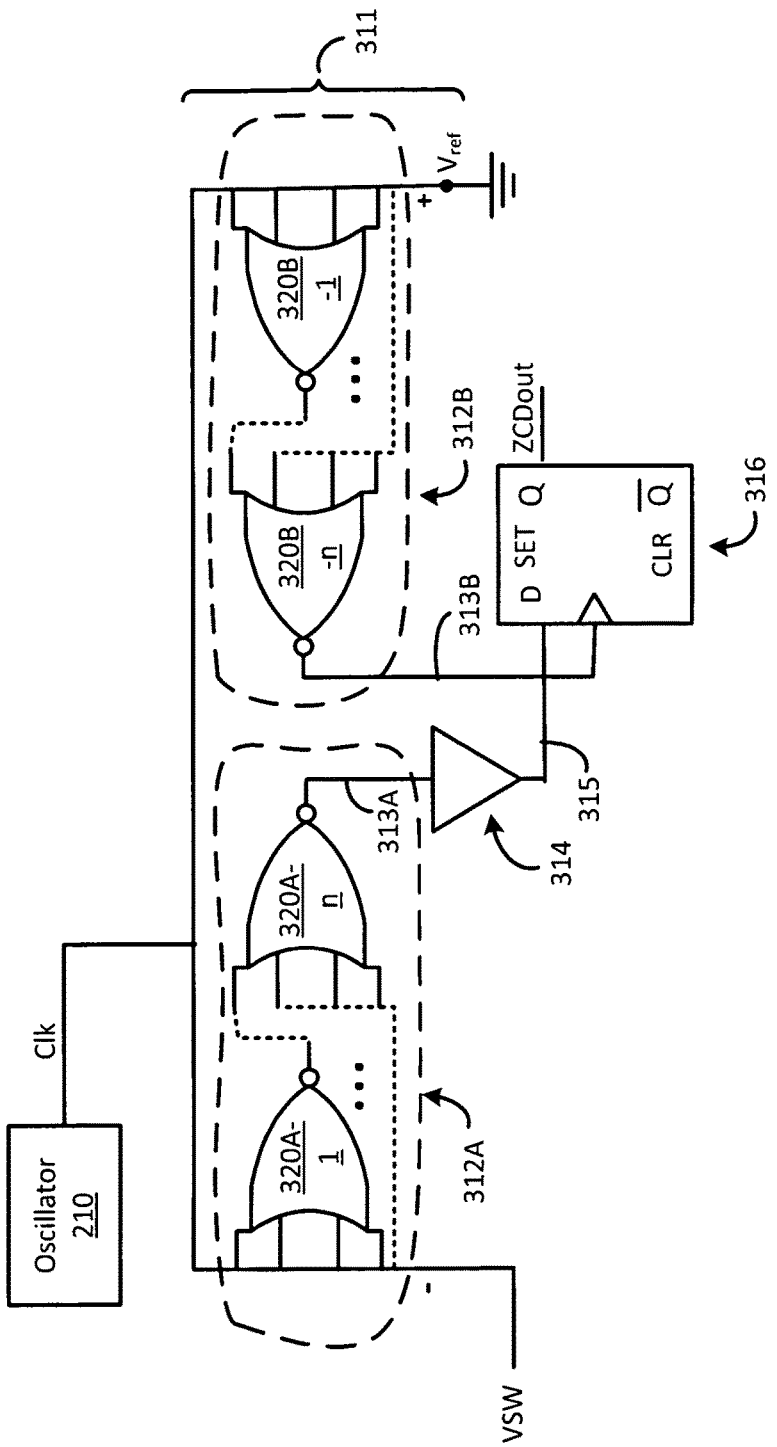
FIG. 3 illustrates another example zero crossing logic circuitry according to one example embodiment of the present disclosure.

FIG. 3 illustrates another example zero crossing logic circuitry 306 according to one example embodiment of the present disclosure. The zero crossing logic circuitry 306 is one example of zero crossing logic circuitry 106 of FIG. 1. The zero crossing logic circuitry 306 corresponds to a gate modulated delay line. In other words, a control input, e.g., Vsw, is applied to a gate input of a process dependent delay element.

The zero crossing logic circuitry 306 of this embodiment includes the oscillator 210, differential clocking circuitry 311 and phase comparator circuitry 316. In some embodiments, the zero crossing logic circuitry 306 may further include offset circuitry 314. The differential clocking circuitry 311 includes first clocking circuitry 312A and second clocking circuitry 312B. First clocking circuitry 312A and second clocking circuitry 312B may each include one or more process-dependent delay units, i.e., delay elements, e.g., logic gates. The first clocking circuitry 312A is configured to clock (i.e., delay) the switch node voltage, Vsw. The second clocking circuitry 312B is configured to clock (i.e., delay) a reference voltage Vref, e.g., ground. The clock signal (Clk) input to the first clocking circuitry 312A and the second clocking circuitry 312B, in this example, may be generated by oscillator 210, as described herein. In this example 306, the first clocking circuitry 312A and the second clocking circuitry 312B each includes a plurality of logic gates.

In the example of FIG. 3, the first clocking circuitry 312A includes a plurality of NOR gates 320A-1, . . . , 320A-n and the second clocking circuitry 312B includes a plurality of NOR gates 320B-1, . . . , 320B-n. Each NOR gate 320A-1, . . . , 320A-n, 320B-1, . . . , 320B-n has a plurality of inputs. One NOR gate input is coupled to the Clk output of oscillator 210 or an output of a prior adjacent NOR gate in the string and a remaining plurality of NOR gate inputs is coupled to Vsw (e.g., first clocking circuitry 312A) or the reference Vref (e.g., second clocking circuitry 312B). Each NOR gate is coupled serially to an adjacent NOR gate and in parallel to a control input. One input of each first NOR gate, i.e., NOR gate 320A-1 and NOR gate 320B-1, in the respective string of NOR gates is coupled to Clk output from oscillator 210. The other inputs of first NOR gate 320A-1 are coupled to Vsw and the other inputs of first NOR gate 320B-1 are coupled to the reference Vref, e.g., ground. A respective output of each first NOR gate 320A-1, 320B-1 is coupled to one input of a corresponding next adjacent NOR in the string of NOR gates 320A-1, . . . , 320A-n,

320B-1, . . . , 320B-n. An output of each last NOR gate 320A-n, 320A-n in the string of NOR gates 320A-1, . . . , 320A-n and 320B-1, . . . , 320B-n, respectively, is coupled to phase comparator circuitry 316. Thus, a plurality of inputs of each NOR gate in the respective pluralities of NOR gates 320A, . . . , 320A-n and 320B-1, . . . , 320B-n are coupled to Vsw or Vref, respectively, and one input is coupled to oscillator 210 or a prior adjacent NOR gate.

Logically, a NOR gate is configured to output a logic one when all inputs are zero and to output a logic zero otherwise. Ideally, a logic gate may not introduce a propagation delay between an input and an output. In reality, there is a nonzero propagation delay between an input and an output for a logic gate. An amount of propagation delay may be related to a magnitude of an input signal to the logic gate. Thus, there may be a propagation delay between the respective inputs and outputs of the first clocking circuitry 312A and the second clocking circuitry 312B. An amount of the delay may then be related to a value of a respective input signal, i.e., Vsw or Vref.

It may be appreciated that a logic gate is an active device that contains a plurality of transistors. The transistors may be coupled to a supply voltage via a pull-up resistor or a complementary transistor as in CMOS logic, and/or to a reference voltage, e.g., ground. Input signals to the logic gate may then be coupled to, e.g., gate inputs of one or more of the transistors. An effect of the input signals on the logic gates is to modulate the pull-up or the pull down intensity an amount related to the magnitude of the input signals which may then affect the propagation delay of the respective logic gate. For example, as an input to the logic gate increases, a corresponding propagation delay may decrease. Propagation delays associated with individual logic gates may be relatively short, e.g., on the order of picoseconds, and the modulation of this delay by a change in the magnitude of the input voltage may be in fractions of picoseconds. Thus, in order to provide a measurable delay, the plurality of logic gates may be coupled together, generally in series, with each logic gate providing an incremental delay related to a value of the gate input voltages, i.e., Vsw or Vref.

In operation, similar to zero crossing logic circuitry 206 of FIG. 2, when Vsw is at or near Vref, the respective propagation delays of first clocking circuitry 312A and second clocking circuitry 312B may be generally similar. Unlike zero crossing logic circuitry 206, if Vsw increases, then a delay between respective rising edges of the first clock signal 313A and the second clock signal 313B may decrease with clock signal 313A arriving earlier and earlier in time.

In the example of FIG. 3, the phase comparator circuitry 316 corresponds to a D-type flip flop. Flip-flop circuitry 316 includes a clock input configured to receive the second clocked signal 313B. Flip-flop circuitry 316 further includes a D input configured to receive the first clocked signal 313A (or a delayed first clocked signal 315). In operation, flip-flop circuitry 316 is configured to latch data incident on the D input in response to a rising edge on the clock input. When Vsw is at or near Vref, a rising edge of the first clocked signal 313A may arrive at the D input at or just after a rising edge of the second clocked signal 313B arrives at the clock input. When Vsw is greater than Vref, a rising edge of the first clocked signal 313A may arrive at the D input prior to a rising edge of the second clocked signal 313B arrives at the clock input. Thus, when Vsw is at or near Vref, flip-flop 316 may latch a zero and if Vsw is greater than Vref, flip-flop 316 may latch a one. In other words, a phase delay (i.e., the second clocked signal 313B arriving at the D flip-flop after the first clocked signal 313A) between the first clocked signal 313A and the second clocked signal 313B may allow the first clocked signal 313A on the D input to set up before the rising edge of the second clocked signal 313B reaches the clock input of flip-flop circuitry 316. The flip-flop circuitry 316 may then latch the logic one corresponding to the first clocked to signal when the second clocked to signal reaches the clock input. The output ZCDout of flip-flop circuitry 316 may be provided to and captured by switch controller circuitry 104. Switch controller circuitry 104 may then be configured to turn off the low side switch 114B and to thus prevent further flow of negative inductor current.

Zero crossing logic circuitry 306 may also include offset circuitry 314 configured to add an additional delay to the first clocked signal 313A prior to provision of the delayed first clocked signal to flip-flop circuitry 316. In other words, offset circuitry 314 is configured to adjust a threshold associated with flip flop circuitry 216. Offset circuitry 314 is configured to generate a delayed output signal 315, where the rising edge of the delayed output signal 315 is delayed compared to the rising edge of first clocked signal 313A. Delaying the first clocked signal 313A is configured to cause flip-flop circuitry 316 to latch a logic zero in response to receiving the first clocked signal when Vsw is less than a threshold voltage, the threshold voltage greater than Vref. The delay time of offset circuitry 315 may be selected based on, for example, a desired margin between the inductor current crossing zero and the low side switch 114B being turned off. The margin is configured to ensure that the low side switch 114B does not turn off while the inductor current is greater than zero. The margin may also provide a measure of noise immunity.

It may be appreciated that, comparing the example zero crossing logic circuitries of FIG. 2 and FIG. 3, there are design tradeoffs associated with the two examples. For example, the ground modulated delay line of FIG. 2 may be relatively more sensitive than the gate modulated delay line of FIG. 3. On the other hand, the gate modulated delay line of FIG. 3 may be easier to layout compared to the ground modulated delay line of FIG. 2.

Figure 4:
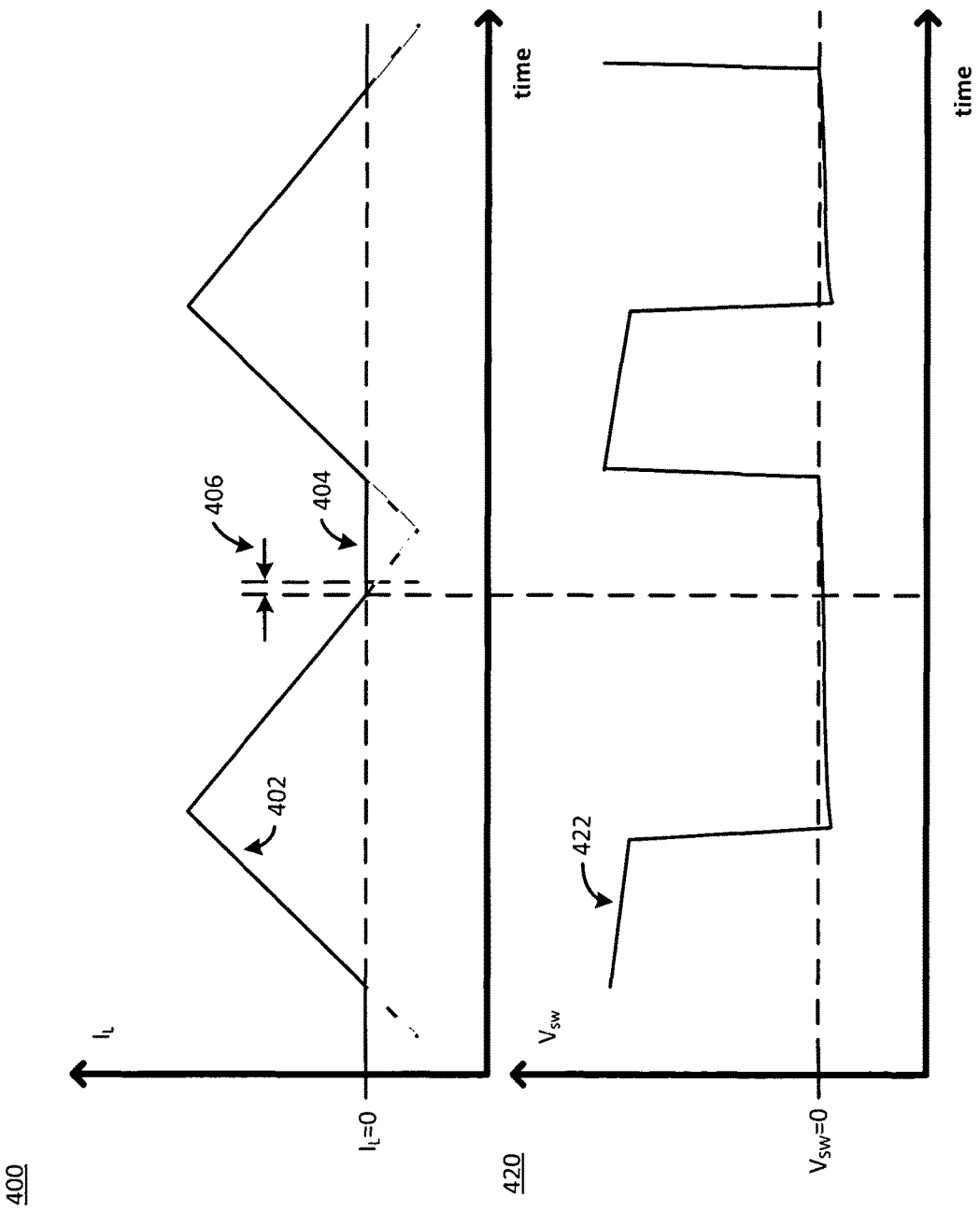
FIG. 4 includes plots illustrating inductor current and switch node voltage consistent with various embodiments of the present disclosure.

FIG. 4 includes plots 400, 420 illustrating inductor current and switch node voltage, Vsw (Vref equal to zero), consistent with various embodiments of the present disclosure. For both plots 400, 420, the horizontal axis corresponds to time and both plots are generally aligned in time. Plot 400 illustrates inductor current 402 over two PWM periods. The inductor current ramps up to a peak then ramps down to zero, remains at zero for a time period 404, ramps up to a peak and then ramps down to zero again. Plot 400 further illustrates a time interval 406 that corresponds to a detection interval for detecting an increase in Vsw to greater than Vref corresponding to the inductor current going negative.

Plot 420 illustrates a waveform 422 corresponding to Vsw. In this example, Vref=0. Values of Vsw are related to respective states of the low side switch 114B and the high side switch 114A and inductor current 402. When the inductor current is ramping up, Vsw is ramping down corresponding to the high side switch 114A on in the low side switch 114B off. When the inductor current is ramping down, Vsw is at or near zero (i.e., Vref), the high side switch 114A is off and the low side switch 114B is on. When the inductor current reaches and/or passes through zero, between ramping up and ramping down, the low side switch 114B may be turned off in response to a signal from, e.g., zero crossing logic circuitry 106, 206, 306. Thus, negative inductor current may be avoided.

Turning again to FIG. 1, in some embodiments, buck converter 102 may include freewheeling switch 120 coupled in parallel with inductor circuitry (L). Freewheeling switch 120 is configured to provide a current path for the inductor circuitry (L) when both the high side switch 114A and the low side switch 114B are turned off. Freewheeling switch 120 is configured to avoid voltage spikes associated with turning the high side switch 114A off or the low side switch 114B off when the inductor circuitry (L) has stored energy, but no path for current flow. Thus, switch controller circuitry 104 may be configured to turn switch 120 on when the high side switch 114A is off and the low side switch 114B is being turned off, as described herein. Freewheeling switch may then be turned off when or just prior to turning on the high side switch 114A (or the low side switch 114B), to prevent short circuiting the load capacitor C.

Thus, circuits, systems and methods may be configured to use a digital delay line to monitor the switch node voltage, to determine whether the switch node voltage is or is starting to rise above a reference and to signal that a low side switch should turn off if Vsw is greater than Vref to prevent the negative inductor current. Thus, the Vsw may be monitored and detection of Vsw greater than Vref may trigger turning off the low side switch. The buck converter may then operate in a diode emulation mode, preventing negative inductor currents and continuous conduction mode losses may be avoided.

Figure 5:
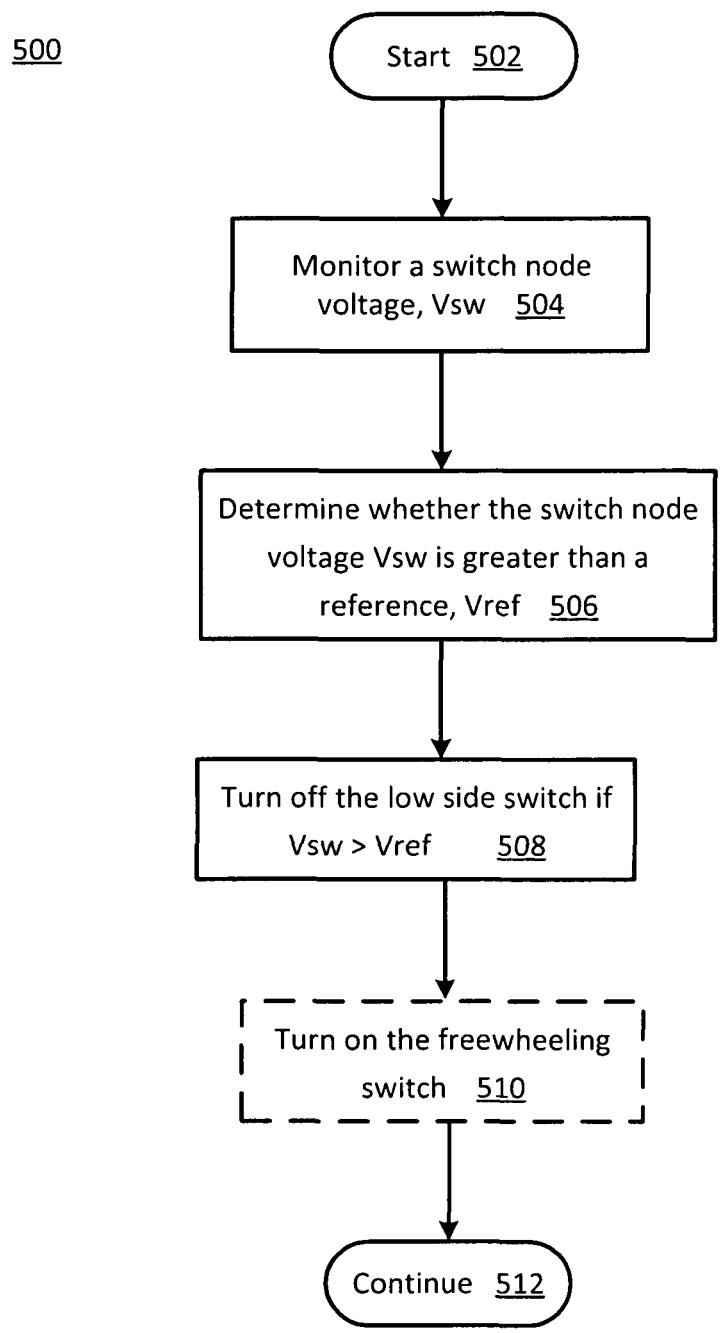
FIG. 5 is a flowchart of zero current switching operations according to one embodiment of the present disclosure.

FIG. 5 is a flowchart of zero current switching operations 500 according to one embodiment of the present disclosure. In particular, the flowchart 500 illustrates one example embodiment of operations for monitoring Vsw and turning off the low side switch it Vsw increases an amount above Vref while the low side switch is turned on. The operations of flowchart 500 may be performed, for example, by zero crossing logic circuitry 106, 206 and/or 306 of FIGS. 1, 2 and 3.

Operations of this embodiment may begin with start 502. Operation 504 may include monitoring a switch node voltage, Vsw. Whether the switch node voltage Vsw is greater than Vref may be determined at operation 506. If the switch node voltage Vsw is greater than Vref, then a low side switch may be turned off at operation 508. In some embodiments, a freewheeling switch may be turned on at operation 510. Turning on the freewheeling switch is configured to provide a path for inductor current when both the high side switch and the low side switch are off. Program flow may continue at operation 512.

While the flowchart of FIG. 5 illustrates operations according to various embodiments, it is to be understood that not all of the operations depicted in FIG. 5 are necessary for other embodiments. In addition, it is fully contemplated herein that in other embodiments of the present disclosure, the operations depicted in FIG. 5, and/or other operations described herein may be combined in a manner not specifically shown in any of the drawings, and such embodiments may include less or more operations than are illustrated in FIG. 5. Thus, claims directed to features and/or operations that are not exactly shown in one drawing are deemed within the scope and content of the present disclosure.

Memory may include one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may include other and/or later-developed types of computer-readable memory.

Embodiments of the operations described herein may be implemented in a system that includes one or more storage devices having stored thereon, individually or in combination, instructions that when executed by one or more processors perform the methods. The processor may include, for example, a processing unit and/or programmable circuitry. The storage device may include a machine readable storage medium including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

As used in any embodiment herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog-Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

Thus, a system, method and apparatus, as described herein, are configured to implement zero current switching.

Circuits, systems and methods are configured to use a digital delay line to monitor the switch node voltage, to determine whether the switch node voltage is at or is starting to rise above reference and to signal that a low side switch should turn off if Vsw is greater than Vref to prevent the negative inductor current. Thus, the Vsw may be monitored and detection of Vsw greater than Vref may trigger turning off the low side switch. The buck converter may then operate in a diode emulation mode, preventing negative inductor currents and continuous conduction mode losses may be avoided.

EXAMPLES

Examples of the present disclosure include subject material such as a method, means for performing acts of the method, a device, at least one machine-readable medium, including instructions that when performed by a machine cause the machine to perform acts of the method, or of an apparatus or system to implement zero current switching as discussed below.

Example 1

According to this example, there is provided an apparatus. The apparatus includes switch controller circuitry to control a conduction state of a high side switch and a low side switch in a DC to DC converter and zero crossing logic circuitry. The zero crossing logic circuitry includes phase comparator circuitry, a first clocking circuitry and a second clocking circuitry. Each clocking circuitry includes one or more delay elements. The zero crossing logic circuitry is to monitor a switch node voltage, Vsw, and to determine whether Vsw is greater than a reference, Vref. The switch controller circuitry is to turn off a low side switch if Vsw is greater than Vref while the low side switch is turned on, Vsw greater than Vref corresponding to a negative inductor current.

Example 2

This example includes the elements of example 1, wherein the first clocking circuitry is to receive the switch node voltage and to provide a first clocked signal output and the second clocking circuitry is to receive the reference and to provide a second clocked signal output, the first clocked signal corresponding to Vsw and the second clocked signal corresponding to the reference.

Example 3

This example includes the elements of example 1 or 2, wherein each clocking circuitry corresponds to a ground modulated delay line.

Example 4

This example includes the elements of example 1 or 2, wherein each clocking circuitry corresponds to a gate modulated delay line.

Example 5

This example includes the elements of example 2, wherein the phase comparator circuitry includes a D flip flop to receive the first clocked signal and the second clocked signal and to provide a digital output that has a first value if Vsw is greater than Vref and a second value otherwise.

Example 6

This example includes the elements of example 1 or 2, wherein the zero crossing logic circuitry further includes offset circuitry to adjust a threshold associated with phase comparator circuitry.

Example 7

This example includes the elements of example 1 or 2, further including a freewheeling switch, the switch controller circuitry to turn on the freewheeling switch when a high side switch is off and the low side switch is being turned off.

Example 8

This example includes the elements of example 3, wherein the first clocking circuitry and the second clocking circuitry each includes a delay oscillator.

Example 9

This example includes the elements of example 3, wherein the zero crossing logic circuitry includes offset circuitry coupled to an output of the second clocking circuitry, the offset circuitry to adjust a threshold associated with phase comparator circuitry.

Example 10

This example includes the elements of example 4, wherein the first clocking circuitry and the second clocking circuitry each includes a plurality of NOR gates.

Example 11

This example includes the elements of example 4, wherein the zero crossing logic circuitry includes offset circuitry coupled to an output of the first clocking circuitry, the offset circuitry to adjust a threshold associated with phase comparator circuitry.

Example 12

This example includes the elements of example 1 or 2, further including an oscillator to provide a clock input to the first clocking circuitry and the second clocking circuitry, the oscillator including a plurality of delay elements.

Example 13

According to this example, there is provided a method. The method includes monitoring, by zero crossing logic circuitry, switch node voltage, Vsw; determining, by the zero crossing logic circuitry, whether Vsw is greater than a reference, Vref. The zero crossing logic circuitry includes phase comparator circuitry, a first clocking circuitry and a second clocking circuitry. Each clocking circuitry includes one or more delay elements. The method further includes turning, by switch controller circuitry, off a low side switch if Vsw is greater than Vref while the low side switch is turned on, Vsw greater than Vref corresponding to a negative inductor current.

Example 14

This example includes the elements of example 13, further including: receiving, by the first clocking circuitry, the switch node voltage and providing, by the first clocking circuitry, a first clocked signal output; and receiving, by the second clocking circuitry, the reference and providing, by the second clocking circuitry, a second clocked signal output including one or more delay elements, the first clocked signal corresponding to Vsw and the second clocked signal corresponding to Vref.

Example 15

This example includes the elements of example 13, wherein each clocking circuitry corresponds to a ground modulated delay line.

Example 16

This example includes the elements of example 13, wherein each clocking circuitry corresponds to a gate modulated delay line.

Example 17

This example includes the elements of example 14, further including, receiving by phase comparator circuitry the first clocked signal and the second clocked signal and providing, by the phase comparator circuitry, a digital output that has a first value if Vsw is greater than Vref and a second value otherwise.

Example 18

This example includes the elements of example 13, further including adjusting, by offset circuitry, a threshold associated with the phase comparator circuitry.

Example 19

This example includes the elements of example 13, further including turning on, by the switch controller circuitry, a freewheeling switch when a high side switch is off and the low side switch is being turned off.

Example 20

This example includes the elements of example 16, wherein the first clocking circuitry and the second clocking circuitry each includes a delay oscillator.

Example 21

This example includes the elements of example 16, further including adjusting, by offset circuitry, a threshold associated with phase comparator circuitry, the offset circuitry coupled to an output of the second clocking circuitry.

Example 22

This example includes the elements of example 17, wherein the first clocking circuitry and the second clocking circuitry each includes a plurality of NOR gates.

Example 23

This example includes the elements of example 17, further including adjusting, by offset circuitry, a threshold associated with phase comparator circuitry, the offset circuitry coupled to an output of the first clocking circuitry.

Example 24

This example includes the elements of example 13, further including providing, by an oscillator, a clock input to the first clocking circuitry and the second clocking circuitry, the oscillator including a plurality of delay elements.

Example 25

According to this example, there is provided a system. The system includes DC to DC converter circuitry, switch controller circuitry to control a conduction state of a high side switch and a low side switch in a DC to DC converter, and zero crossing logic circuitry. The zero crossing logic circuitry includes phase comparator circuitry, a first clocking circuitry and a second clocking circuitry, each clocking circuitry including one or more delay elements. The zero crossing logic circuitry is to monitor a switch node voltage, Vsw, and to determine whether Vsw is greater than a reference, Vref. The switch controller circuitry is to turn off a low side switch if Vsw is greater than Vref while the low side switch is turned on, Vsw greater than Vref corresponding to a negative inductor current.

Example 26

This example includes the elements of example 25, wherein the first clocking circuitry is to receive the switch node voltage and to provide a first clocked signal output and the second clocking circuitry is to receive the reference and to provide a second clocked signal output, the first clocked signal corresponding to Vsw and the second clocked signal corresponding to the reference.

Example 27

This example includes the elements of example 25 or 26, wherein each clocking circuitry corresponds to a ground modulated delay line.

Example 28

This example includes the elements of example 25 or 26, wherein each clocking circuitry corresponds to a gate modulated delay line.

Example 29

This example includes the elements of example 26, wherein the phase comparator circuitry includes a D flip flop to receive the first clocked signal and the second clocked signal and to provide a digital output that has a first value if Vsw is greater than Vref and a second value otherwise.

Example 30

This example includes the elements of example 25 or 26, wherein the zero crossing logic circuitry further includes offset circuitry to adjust a threshold associated with the phase comparator circuitry.

Example 31

This example includes the elements of example 25 or 26, further including a freewheeling switch, the switch controller circuitry to turn on the freewheeling switch when a high side switch is off and the low side switch is being turned off.

Example 32

This example includes the elements of example 28, wherein the first clocking circuitry and the second clocking circuitry each includes a delay oscillator.

Example 33

This example includes the elements of example 28, wherein the zero crossing logic circuitry includes offset circuitry coupled to an output of the second clocking circuitry, the offset circuitry to adjust a threshold associated with phase comparator circuitry.

Example 34

This example includes the elements of example 29, wherein the first clocking circuitry and the second clocking circuitry each includes a plurality of NOR gates.

Example 35

This example includes the elements of example 29, wherein the zero crossing logic circuitry includes offset circuitry coupled to an output of the first clocking circuitry, the offset circuitry to adjust a threshold associated with phase comparator circuitry.

Example 36

This example includes the elements of example 25 or 26, further including an oscillator to provide a clock input to the first clocking circuitry and the second clocking circuitry, the oscillator including a plurality of delay elements.

Example 37

According to this example, there is provided a system. The system includes at least one device arranged to perform the method of any one of claims 13 to 24.

Example 38

According to this example, there is provided a device. The device includes means to perform the method of any one of claims 13 to 24.

Example 39

According to this example, there is provided a computer readable storage device having stored thereon instructions that when executed by one or more processors result in the following operations including: the method according to any one of claims 13 to 24.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. An apparatus comprising:
   switch controller circuitry to:
     monitor a switch node voltage (Vsw); and
     control a conduction state of a high side switch and a low side switch in a DC to DC converter, the DC to DC converter including an inductor;
   zero crossing logic circuitry comprising phase comparator circuitry, a first clocking circuitry and a second clocking circuitry, each clocking circuitry comprising one or more delay elements, wherein the zero crossing logic circuitry is to:
     monitor Vsw; and
     determine whether Vsw is greater than a reference voltage (Vref); and
   wherein the switch controller circuitry is further to turn off the low side switch if Vsw is greater than Vref while the low side switch is turned on, Vsw greater than Vref corresponding to a negative inductor current through the inductor.

2. The apparatus of claim 1, wherein the first clocking circuitry is to receive Vsw and to provide a first clocked signal output and the second clocking circuitry is to receive Vref and to provide a second clocked signal output, the first clocked signal corresponding to Vsw and the second clocked signal corresponding to Vref.

3. The apparatus of claim 2, wherein the phase comparator circuitry comprises a D flip flop to receive the first clocked signal and the second clocked signal and to provide a digital output that has a first value if Vsw is greater than Vref and a second value otherwise.

4. The apparatus of claim 1, wherein each clocking circuitry corresponds to a ground modulated delay line.

5. The apparatus of claim 4, wherein the first clocking circuitry and the second clocking circuitry each comprises a delay oscillator.

6. The apparatus of claim 1, wherein each clocking circuitry corresponds to a gate modulated delay line.

7. The apparatus of claim 1, wherein the zero crossing logic circuitry further comprises offset circuitry to adjust a threshold associated with phase comparator circuitry.

8. The apparatus of claim 1, further comprising a freewheeling switch coupled in parallel with the inductor, the switch controller circuitry to turn on the freewheeling switch when a high side switch is off and the low side switch is being turned off.

9. The apparatus of claim 1, further comprising an oscillator to provide a clock input to the first clocking circuitry and the second clocking circuitry, the oscillator comprising a plurality of delay elements.

10. A method comprising:
    monitoring, by switch controller circuitry, switch node voltage (Vsw);
    controlling, by the switch controller circuitry, a conduction state of a high side switch and a low side switch in a DC to DC converter, the DC to DC converter including an inductor;
    determining, by the zero crossing logic circuitry, whether Vsw is greater than a reference voltage (Vref), the zero crossing logic circuitry comprising phase comparator circuitry, a first clocking circuitry and a second clocking circuitry, each clocking circuitry comprising one or more delay elements; and
    turning, by the switch controller circuitry, off the low side switch if Vsw is greater than Vref while the low side switch is turned on, Vsw greater than Vref corresponding to a negative inductor current through the inductor.

11. The method of claim 10, further comprising:
receiving, by the first clocking circuitry, Vsw and providing, by the first clocking circuitry, a first clocked signal output; and
receiving, by the second clocking circuitry, Vref and providing, by the second clocking circuitry, a second clocked signal output comprising one or more delay elements,
the first clocked signal corresponding to Vsw and the second clocked signal corresponding to Vref.

12. The method of claim 11, further comprising:
receiving, by phase comparator circuitry, the first clocked signal and the second clocked signal; and
providing, by the phase comparator circuitry, a digital output that has a first value if Vsw is greater than Vref and a second value otherwise.

13. The method of claim 10, wherein each clocking circuitry corresponds to a ground modulated delay line.

14. The method of claim 10, wherein each clocking circuitry corresponds to a gate modulated delay line.

15. The method of claim 10, further comprising adjusting, by offset circuitry, a threshold associated with the phase comparator circuitry.

16. The method of claim 10, further comprising turning on, by the switch controller circuitry, a freewheeling switch when a high side switch is off and the low side switch is being turned off, the freewheeling switch coupled in parallel with the inductor.

17. The method of claim 10, further comprising providing, by an oscillator, a clock input to the first clocking circuitry and the second clocking circuitry, the oscillator comprising a plurality of delay elements.

18. A system comprising:
DC to DC converter circuitry, the DC to DC converter circuitry including at least an inductor;
switch controller circuitry to:
monitor a switch node voltage (Vsw); and
control a conduction state of a high side switch and a low side switch in the DC to DC converter circuitry; and
zero crossing logic circuitry comprising phase comparator circuitry, a first clocking circuitry and a second clocking circuitry, each clocking circuitry comprising one or more delay elements, wherein the zero crossing logic circuitry is to:
monitor Vsw; and
determine whether Vsw is greater than a reference voltage (Vref); and
wherein the switch controller circuitry is further to turn off the low side switch if Vsw is greater than Vref while the low side switch is turned on, Vsw greater than Vref corresponding to a negative inductor current through the inductor.

19. The system of claim 18, wherein the first clocking circuitry is to receive Vsw and to provide a first clocked signal output and the second clocking circuitry is to receive Vref and to provide a second clocked signal output, the first clocked signal corresponding to Vsw and the second clocked signal corresponding to Vref.

20. The system of claim 19, wherein the phase comparator circuitry comprises a D flip flop to receive the first clocked signal and the second clocked signal and to provide a digital output that has a first value if Vsw is greater than Vref and a second value otherwise.

21. The system of claim 18, wherein each clocking circuitry corresponds to a ground modulated delay line.

22. The system of claim 18, wherein each clocking circuitry corresponds to a gate modulated delay line.

23. The system of claim 18, wherein the zero crossing logic circuitry further comprises offset circuitry to adjust a threshold associated with the phase comparator circuitry.

24. The system of claim 18, further comprising a freewheeling switch coupled in parallel with the inductor, the switch controller circuitry to turn on the freewheeling switch when a high side switch is off and the low side switch is being turned off.

25. The system of claim 18, further comprising an oscillator to provide a clock input to the first clocking circuitry and the second clocking circuitry, the oscillator comprising a plurality of delay elements.

* * * * *